US012615715B2

(12) United States Patent
Freitag et al.

(10) Patent No.: US 12,615,715 B2
(45) Date of Patent: Apr. 28, 2026

(54) CONNECTION INTERFACE FOR CONNECTING A FLEXIBLE PRINTED CIRCUIT BOARD

(71) Applicant: Airbus Operations GmbH, Hamburg (DE)

(72) Inventors: Klaus-Udo Freitag, Hamburg (DE); Yener Palit, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 242 days.

(21) Appl. No.: 18/616,668

(22) Filed: Mar. 26, 2024

(65) Prior Publication Data

US 2024/0334602 A1      Oct. 3, 2024

(30) Foreign Application Priority Data

Mar. 31, 2023      (EP) ..................................... 23166185

(51) Int. Cl.
| | |
|---|---|
| *H05K 1/11* | (2006.01) |
| *H01R 12/59* | (2011.01) |
| *H01R 12/71* | (2011.01) |
| *H05K 1/14* | (2006.01) |

(52) U.S. Cl.
CPC ........... *H05K 1/118* (2013.01); *H01R 12/592* (2013.01); *H01R 12/716* (2013.01); *H05K 1/147* (2013.01); *H05K 2201/10189* (2013.01)

(58) Field of Classification Search
CPC .................. H05K 1/118; H05K 1/147; H05K 2201/10189; H01R 12/592; H01R 12/716
See application file for complete search history.

(56) References Cited

U.S. PATENT DOCUMENTS

| | | | | | |
|---|---|---|---|---|---|
| 5,967,799 | A | * | 10/1999 | Arai ..................... | H01R 12/775 |
| | | | | | 439/108 |
| 2009/0017645 | A1 | | 1/2009 | Suzuki et al. | |
| 2010/0130045 | A1 | | 5/2010 | Higuchi | |
| 2010/0304591 | A1 | | 12/2010 | Ishishita et al. | |
| 2022/0158385 | A1 | | 5/2022 | Gross | |

FOREIGN PATENT DOCUMENTS

| | | |
|---|---|---|
| WO | 2008135811 A2 | 11/2008 |
| WO | 2009069108 A2 | 6/2009 |

OTHER PUBLICATIONS

European Search Report for corresponding European Patent Application No. 23166185 dated Sep. 26, 2023.

* cited by examiner

*Primary Examiner* — Sherman Ng
(74) *Attorney, Agent, or Firm* — Greer Burns & Crain Ltd.

(57)      ABSTRACT

A connection interface for connecting a flexible printed circuit to an electrical equipment and a printed circuit board, comprising a first contact area configured to receive signals from the flexible printed circuit, a second contact area configured to transmit the signals from the first contact area to the printed circuit board, and a connector cap configured to transmit the signals from the first contact area to the second contact area. The first contact area and the second contact area are arranged in neighbored areas at the connector cap.

14 Claims, 6 Drawing Sheets

CONNECTION INTERFACE FOR CONNECTING A FLEXIBLE PRINTED CIRCUIT BOARD

CROSS-REFERENCES TO RELATED APPLICATIONS

This application claims the benefit of European Patent Application Number 23 166 185.1 filed on Mar. 31, 2023, the entire disclosure of which is incorporated herein by way of reference.

FIELD OF THE INVENTION

The present invention pertains to a connection interface for connecting a flexible printed circuit (FPC) to an electrical equipment and a printed circuit board (PCB), comprising a first contact area configured to receive signals from the FPC, a second contact area configured to transmit the signals from the first contact area to the PCB, and a connector cap configured to transmit the signals from the first contact area to the second contact area, wherein the first contact area and the second contact area are arranged in neighbored areas at the connector cap. The connection interface enables direct FPC wiring connection without using a two-part solution.

BACKGROUND OF THE INVENTION

Using electrical wiring like flexible printed circuits becoming more popular in areas with limited space. Because FPCs are flexible and bendable, FPCs allowing a greater degree of freedom in design and application. For example, FPCs can also fit into very small areas or have an uneven shape, which cannot achieved with rigid boards.

Considering the interior architecture of an airplane as an example, e. g., of a large passenger aircraft, the space for accommodate the different electronic elements and the associated wirings may be limited. In particular, when connecting the electrical wirings additional pin connections or adaptions may be needed.

Common solutions for assembling such electronic wirings to other parts or equipment of the aircraft are complex and time-consuming. Using pin connections to fulfil the aircraft cabin requirements may not be comfortable due to cramped spatial conditions.

Prior art solutions using a pin connection are realized with one connector part on the loosen routing side with the aircraft wiring and one second connector part as an opposite connection interface on the equipment or the connected device. In other words, a fixed part and a loosen part is needed.

Against this background, it is an object of the present invention to find solutions for wiring connections that are simple in construction, lightweight and easy to handle. Furthermore, it is an object of the present invention to provide a wiring connecting having reduced overall dimensions which enables to accommodate the connection in the limited space of an aircraft.

SUMMARY OF THE INVENTION

The forgoing objects may be achieved by a connection interface according to one or more embodiments described herein.

According to an aspect of the invention, a connection interface for connecting a flexible printed circuit to a printed circuit board is provided, comprising a first contact area configured to receive signals from the flexible printed circuit, a second contact area configured to transmit the signals from the first contact area to the printed circuit board, and a connector cap configured to transmit the signals from the first contact area to the second contact area, wherein the first contact area and the second contact area are arranged in neighbored areas at the connector cap. This enables a direct FPC wiring connection having reduced number of "loosen" elements and a reduced overall height.

Thus, one idea of the present invention is to implement a simple connection interface mechanism for a FPC, wherein the FPC is connected directly at the connector, without using a connector interface duplication. Thus, the connection interface requires only one connection interface instead of two as the male- and female-connections of the state of the art.

The arrangement of the first and second contact areas at the connector cap helps to connect the FPC in a small assembly space to the PCB, e.g., in a reduced constructional height.

The presently described connection interface is simple in construction and yet suitable for small accommodation spaces providing a standard solution interface. The connection interface allows a simple interface production and a simple integration and installation process for the equipment or part devices. Advantageously, no connector assembling on routing wiring side is necessary. This enables to reduce the required elements and consequently reduces the weight of the entire interface. Further, the described connection interface enables a full automatic production line and supports endless wiring interface solution.

The first and second contact areas may be provided next to each other at the connector cap. These areas may enable to contact the FPC and the PCB at the same side of the connector cap. This means in particular, that the contact areas are provided at one surface of the connector cap to contact the FPC and the PCB arranged parallel to each other, wherein the FPC may partially overlap the PCB. Since the FPC may partially overlap the PCB, both, the FPC and the PCB may provide contact areas to contact the first and second contact area of the connector cap respectively.

In other word, the connector cap may provide one contact side, on which the contact areas may be arranged. This enables to provide a flat connector cap with connection areas at one surface of the connector cap to contact the FPC and the PCB at the same surface of the connector cap. Therefore, the connector cap may be placed in parallel to the FPC and the PCB when arranged in a contacted position.

To achieve a connection between the FPC and the PCB, the FPC may be inserted between the connector cap and the PCB. A separation may be placed between the first contact area and the second contact area to prevent the FPC to slide into the second contact area. The separation may be provided at the connector cap and/or at the PCB. Subsequently, the connector cap may be fastened with the PCB, in particular with the housing of the PCB, to provide a direct connection interface between the FPC and the PCB.

According to an embodiment of the invention, the connector cap may comprise a plastic material, in particular provided with a metal-coating. The connector cap may be completely provided with a metal-coating to ensure electromagnetic interference protection (EMI) and/or short circuit protection. It is to be understood that, alternatively or additionally, also other materials may be suitable, e.g., depending on the size and the expected loads and stresses acting on the connector cap.

According to an embodiment of the invention, the connector cap is configured to be arranged parallel to the flexible printed circuit and the printed circuit board when the first and second contact areas are in a contacted position with the flexible printed circuit and the printed circuit board.

If the contact areas are provided at the same surface or same side of the connector cap, the connector cap may be placed in parallel to the FPC and the PCB when arranged in the contacted position. This enables a low constructional height of the entire connection interface, which enables to stack a number of connection interfaces to save installation space.

According to an embodiment of the invention, the connector cap is configured to be arranged parallel to the flexible printed circuit and transverse to the printed circuit board when the first and second contact areas are in a contacted position with the flexible printed circuit and the printed circuit board.

This enables different design options dependent on the available space and the technical conditions.

According to an embodiment of the invention, the first contact area and/or the second contact area comprise several contact elements.

The contact elements of the first and second contact area may be oriented in the same direction to contact the FPC and the PCB at the same side of the connector cap. The contact elements may contact the FPC and the PCB respectively in a direction transverse to a level of the connector cap. The level of the connector cap may be defined by a plane parallel to the first and second contact areas.

According to an embodiment of the invention, the contact elements of the first contact area comprise lower side contact elements and upper side contact elements, and the flexible printed circuit is configured to be placed between the lower side contact elements and upper side contact elements.

The upper side elements may be arranged at the connector cap. The lower side elements may be arranged at the PCB, wherein the signals from the FPC may be transmitted by the upper side elements to the connector cap.

According to an embodiment of the invention, the contact elements of the second contact area comprise lower side contact elements and upper side contact elements, wherein the printed circuit board is configured to be contacted with the lower side contact elements, and the upper side contact elements contact the lower side elements in a contacted position.

The upper side contact elements may be arranged at the connector cap. The lower side contact elements may be arranged at the PCB, wherein the signals from the contact elements of the first contact area may be transmitted by the upper side elements to the PCB and/or vice versa to the same or a next FPC wiring interface of the same equipment.

According to an embodiment of the invention, the connection interface further comprises a housing for receiving the printed circuit board, wherein the connector cap is configured to be fastened at the housing.

The housing my accommodate the PCB and may provide an installation space for the connector cap. The lower side elements may be arranged in a feed-through area of the housing.

The housing may have a flat shape following the shape of the PCB, wherein different design wishes may be implemented. The housing and the connector cap may be stacked to safe installation space, e. g., in an interior architecture of an airplane.

According to an embodiment of the invention, the connector cap is fastened by at least one screw, clamp or bayonet fixation, and/or the connector cap is fastened by a hinge clap mechanism.

Using only screws may provide a connector cap independent from the housing. In an embodiment, two to four screws may be used to fix the connector cap at the housing. In another embodiment, the connection cap may be permanently fixed with the housing. In this case, a hinge clap mechanism may be used which enables to angle the connector cap relative to the housing to insert the FPC between the connector cap and the housing.

According to an embodiment of the invention, the connector cap may be fastened by at least one clipped lever lock, aircraft camloc fastener, turnlock and/or one touch fastener. In particular two to four of these fasteners may be used to fix the connector cap to the housing.

According to an embodiment of the invention, the flexible printed circuit is configured to be placed between the housing and the connector cap.

To achieve a connection between the FPC and the PCB, the FPC may be inserted between the connector cap and the PCB. Subsequently, the connector cap may be fastened with the PCB, in particular with the housing of the PCB, to provide a direct connection interface between the FPC and the PCB. Preferably, the FPC may be inserted between connector cap and the PCB to contact the first contact area without contacting the second contact area. Thus, the second contact area may contact the PCB to enable the direct connection interface.

According to an embodiment of the invention, connection lines are arranged to contact the second contact area with the printed circuit board, wherein the connection lines are angles within the housing.

This is advantageous in the case when the connector cap is arranged at the housing in a position transvers to the longitudinal orientation of the PCB. Some design wished may require the connector cap to be placed in positions not parallel to the longitudinal direction of the PCB. Therefore, the connection lines within the housing may enable to contact the second contact area with the PCB independent of an angular position between the connector cap and the PCB.

According to an embodiment of the invention, the housing comprises a recess, wherein the connector cap is configured to be places within the recess.

This enable a more reduced constructional height of the entire connection interface. In particular, the recess have a height dependent on a height of the connector cap. In this case, the entire connection interface may have a constant height which enables to stack a number of connection interfaces and save space.

According to an embodiment of the invention, a seal is arranged between the connector cap and the housing.

The seal may protect the first and second contact area from dust, moisture and other debris. In particular, the seal may protect a feed-through area of the contact area from dust, moisture and other debris. According to an embodiment, the seal may be arranged between the housing and the PCB, between the housing and the FPC and between FPC and the connector cap.

According to an embodiment of the invention, the connector cap comprises a flange configured to be contacted with the housing.

The seal may be placed at the flange of the connector cap, wherein the flange may be also used as a connection space to place the at least one screw, clipped lever lock, aircraft camloc fastener, turnlock, one touch fastener and/or the hinge clamp mechanism.

According to an embodiment of the invention, the connector cap comprises more than one first contact area and more than one second contact area arranged in neighbored areas at the connector cap configured to receive signals from more than one flexible printed circuit.

This enables to connect a number of FPCs with only one connection interface, wherein different designs conditions may be considered.

According to an embodiment, identical combinations of first and second contact areas may be placed next to each other at the connector cap to provide a connection interface for a number of FPCs. The combinations of first and second contact areas may have the same width or may be configured with different widths.

BRIEF DESCRIPTION OF THE DRAWINGS

The present invention is explained in more detail below with reference to the embodiments shown in the schematic figures.

Figure 1:
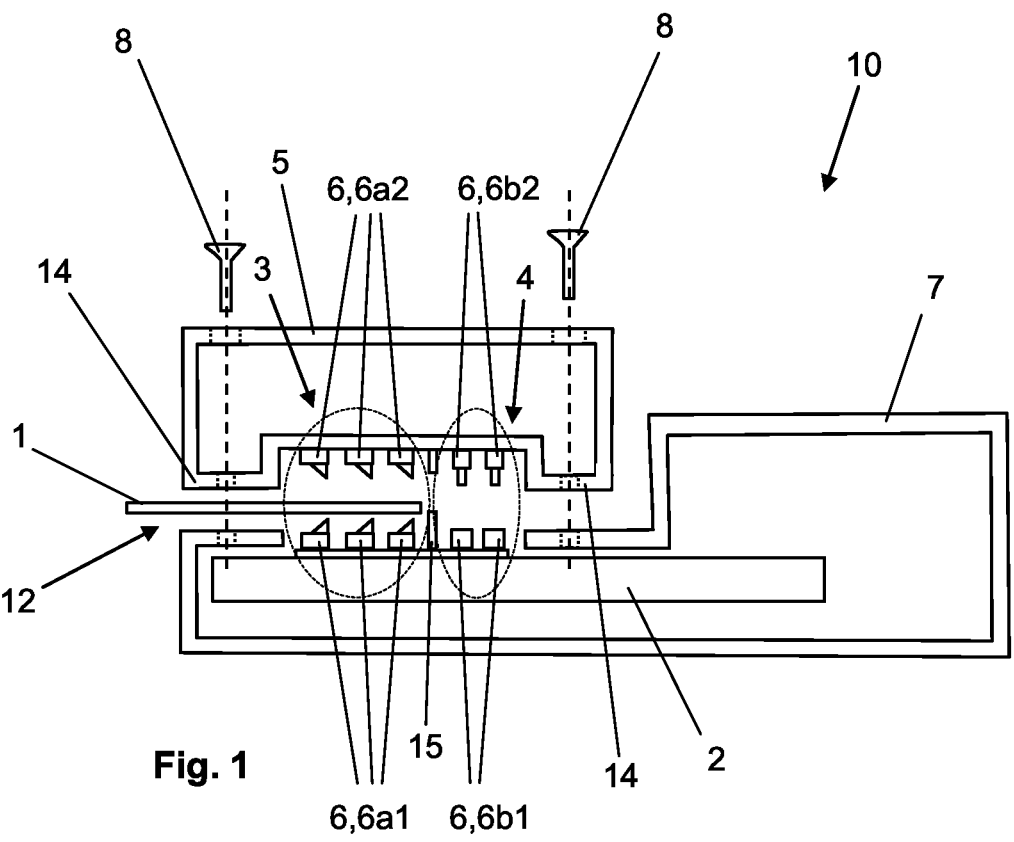
FIG. 1 schematically depicts a cross-sectional view of a connection interface according to an embodiment of the invention.

In the figures of the drawing, elements, features and components which are identical, functionally identical and of identical action are denoted in each case by the same reference designations unless stated otherwise.

Although specific embodiments are illustrated and described herein, it will be appreciated by those of ordinary skill in the art that a variety of alternate and/or equivalent implementations may be substituted for the specific embodiments shown and described without departing from the scope of the present invention. Generally, this application is intended to cover any adaptations or variations of the specific embodiments discussed herein.

DETAILED DESCRIPTION OF THE PREFERRED EMBODIMENTS

FIG. 1 shows a cross-sectional view of a connection interface 10 according to an embodiment of the invention. The connection interface 10 comprises a first contact area 3 configured to receive signals from a flexible printed circuit (FPC) 1, and a second contact area 4 configured to transmit the signals from the first contact area 3 to a printed circuit board (PCB) 2. A connector cap 5 is provided to transmit the signals from the first contact area 3 to the second contact area 4, wherein the first contact area 3 and the second contact area 4 are arranged next to each other at the connector cap 5. The PCB 2 is arranged in a housing 7. The connector cap 5 is arranged in parallel with the FPC 1 and is provided in a recess 12 of the housing 7. This enables a low constructional height of the entire connection interface 10.

As can be seen in FIG. 1, the first contact area 3 and the second contact area 4 comprise several contact elements 6. The contact elements 6a of the first contact area 3 comprise lower side contact elements 6a1 and upper side contact elements 6a2. The FPC 1 is configured to be placed between the lower side contact elements 6a1 and upper side contact elements 6a2 to be contacted with the first contact area 3. Further, the contact elements 6b of the second contact area 4 comprise lower side contact elements 6b1 and upper side contact elements 6b2. The PCB 2 in contact with the lower side contact elements 6b1 and the lower side contact elements 6b1 contact the upper side elements 6b2 in a contacted position, when the connector cap 5 is fixed at the housing 7. The upper side contact elements 6a2, 6b2 are placed in a recess of the connector cap 5. The lower side elements 6a1, 6b1 are arranged in a feed-trough area of the housing 7.

A separation 15 may be placed between the first contact area 3 and the second contact area 4. The separation 15 prevents the FPC 1 to slide into the second contact area 4. The separation 15 may be provided at the connector cap 5 and/or the PCB 2 to provide a stop for the FPC 1.

A seal 13 may be placed between the PCB 2 and the housing 7, between the housing 7 and the FPC 1 and/or between the FPC 1 and the connector cap 5. A seal 13 according to an embodiment is shown in FIG. 2.

Advantageously, the connection interface 10 needs only one connecting interface instead of two as known connectors of the state of the art. Therefore, a "loosen part" with a male- and female-connection is no longer required for connecting the FPC with the PCB. Further, the connector interface 10 provides a simple installation process at the aircraft, wherein aircraft installation requirements are fulfilled.

In the depicted example of FIG. 1 the connector cap 5 is fixed by screws 8 at the housing 7. With reference to FIG. 2, an alternative embodiment is shown that is basically similar to the embodiment of FIG. 1. However, in this case the connection cap 5 is fixed at the housing by a hinge clap mechanism 9 including a single fixation 9a at one side of the connector cap 5.

Figure 2:
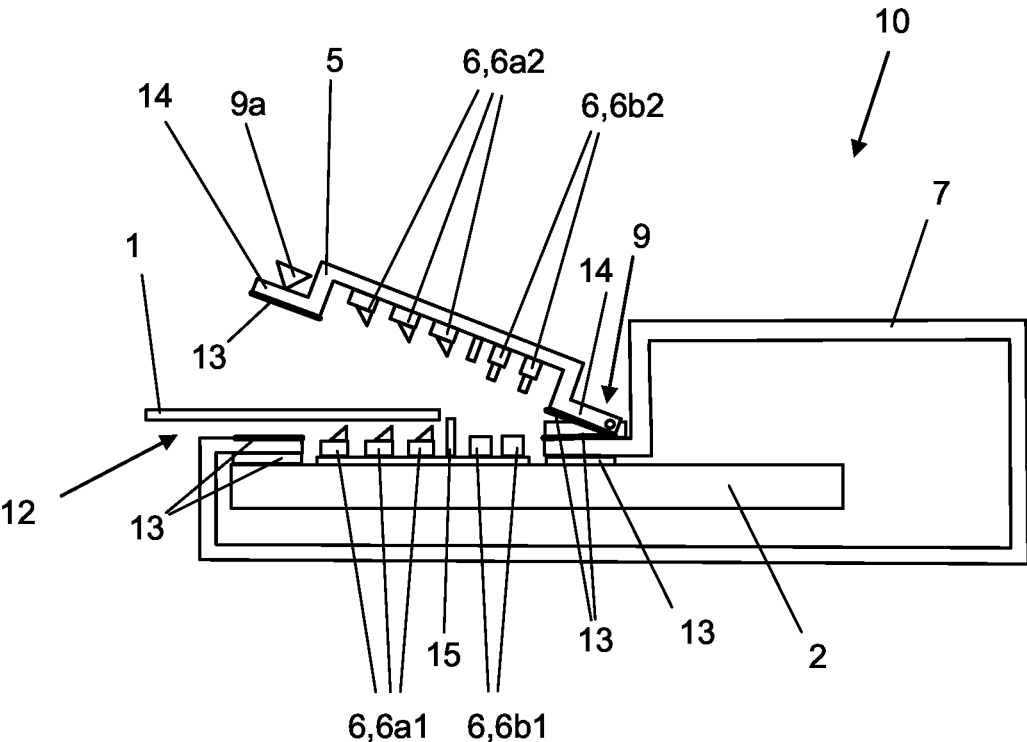
FIG. 2 schematically depicts a cross-sectional view of a connection interface according to another embodiment of the invention.

FIG. 2 shows a non-contacted position, wherein the connector cap 5 is angled with respect to the recess 12 of the housing 7. For connecting the contact elements 6a, 6b with each other the connector cap 5 have to be pivoted till the single fixation 9a contacts the housing 7. This embodiment prevents losing the connector cap 5 or screws 8 during the installation process of the connection.

Figures 3A, 3B, 3C, 3D, 4, 5:
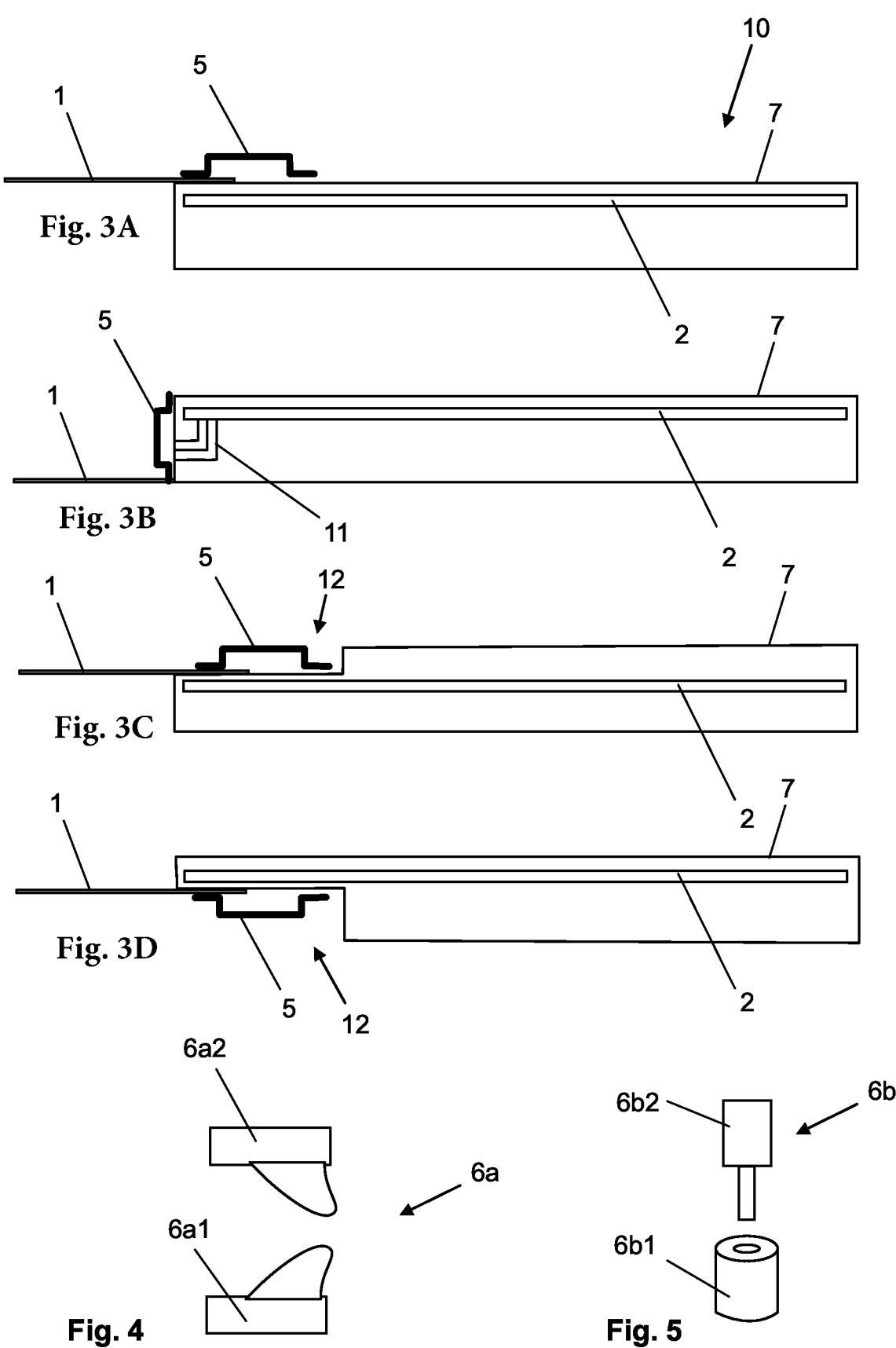
FIG. 3A schematically depicts a cross-sectional view of a first connection interface according to further embodiment of the invention.
FIG. 3B schematically depicts a cross-sectional view of a second connection interface according to further embodiment of the invention.
FIG. 3C schematically depicts a cross-sectional view of a third connection interface according to further embodiment of the invention.
FIG. 3D schematically depicts a cross-sectional view of a fourth connection interface according to further embodiment of the invention.
FIG. 4 schematically depicts a cross-sectional view of a contact element.
FIG. 5 schematically depicts a cross-sectional view of another contact element.

FIGS. 3A to 3D shows different cross-sectional view of an connection interface 10 according to further embodiments of the invention. According to FIG. 3A the connector cap 5 is fixed at a top surface of the housing 7, wherein the connector cap 5 is arranged in parallel to the FPC 1 and the PCB 2. FIG. 3B describes an embodiment with the connector cap 5 arranged parallel to the FPC 1 but transverse to the PCB 2. To contact the second contact area 4 with the printed circuit board 2 connection lines 11 are provided in the housing, wherein the connection lines 11 are angles within the housing 7. FIGS. 3C and 3D show different embodiment with the connector cap 5 placed in a recess 12 of the housing 7. These embodiments enable a more reduced constructional height of the entire connection interface 10.

The person of skill will readily conceive other solutions based on different specific implementations of the connector cap 5 at the housing 7.

FIG. 4 shows a cross-sectional view of two corresponding contact elements 6a of the first contact area 3. The lower and upper contact elements 6a1 and 6a2 are tapping connection devices having spring elements or other contacts.

FIG. 5 shows a cross-sectional view of contact elements 6b of the second contact area 4. An upper side contact element 6b2 provides a tapping interface to a PCB connection device as a lower side contact element 6b1. The contact elements 6b are also provided with spring elements or other contacts.

As illustrated with reference to FIG. 6, the connection interface 10 may also be accommodate more than one FPC 1. The different FPCs 1 are placed next to each other to connect neighbored first contact areas 3 respectively. A longitudinal separation 16 is provided between the neighbored FPCs 1 to prevent the FPCs 1 to contact with each other. The longitudinal separation 16 may be provided within the connector cap 5 as a spacer. In addition or alternatively, the longitudinal separation 16 may be provided within the housing 7 as a spacer. The spacer may have the same height as the FPC 1 and/or may be serve as a stop for the FPC 1 when the FPC 1 is inserted in the connection interface 10.

Figure 6:
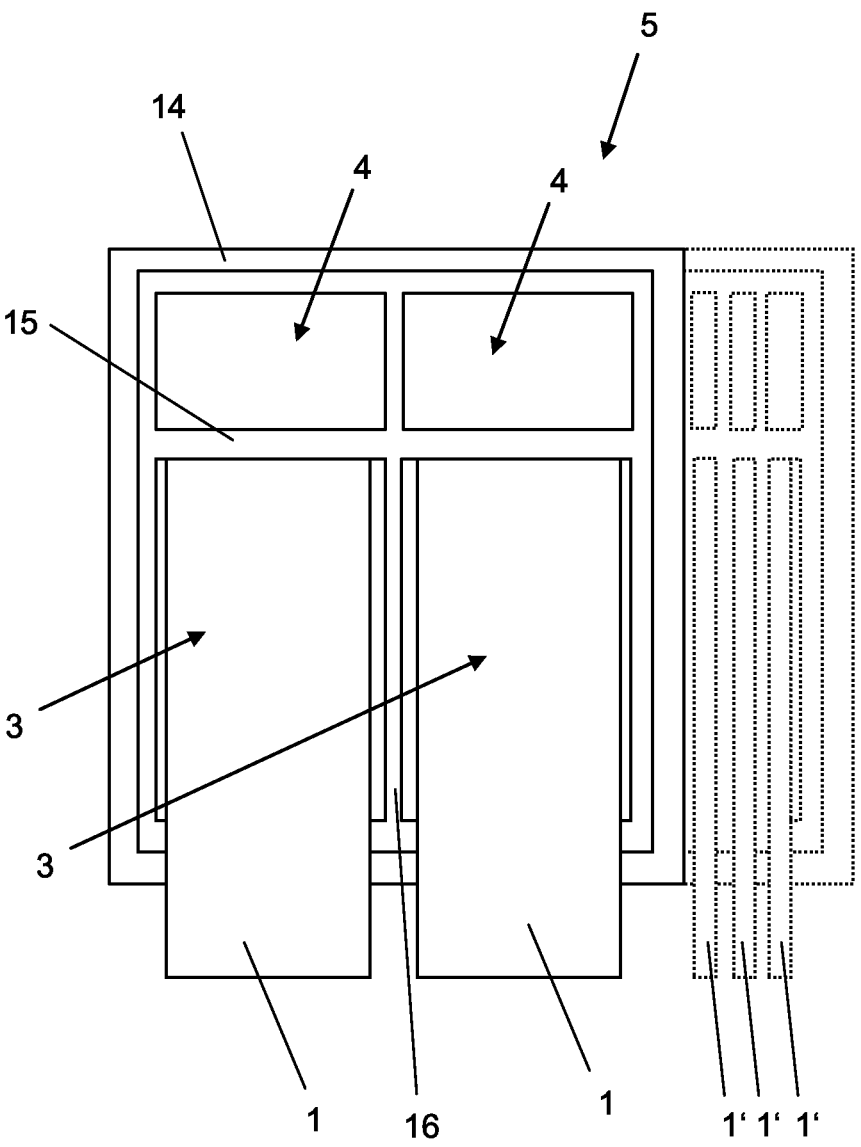
FIG. 6 schematically depicts a view of an connection cap according to another embodiment of the invention.

According to FIG. 6, more than two FPCs 1' may be arranged side by side as shown with dashed lines.

Figures 7, 8:
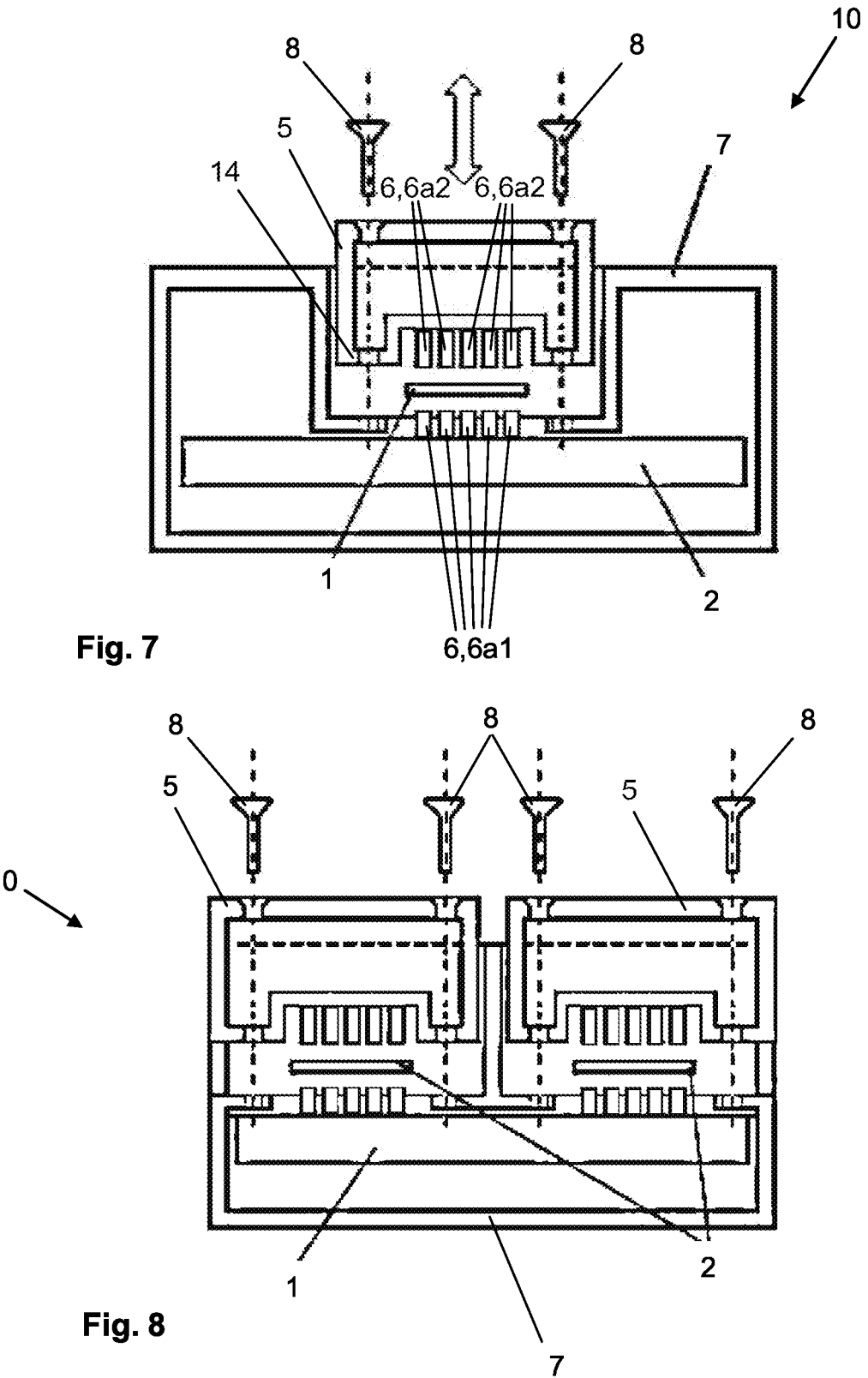
FIG. 7 schematically depicts another cross-sectional view of a connection interface according to FIG. 1 of the invention.
FIG. 8 schematically depicts a cross-sectional view of a connection interface according to another embodiment of the invention.

FIG. 7 shows a another cross-sectional view of a connection interface 10 according to FIG. 1 of the invention. The cross-sectional view is transverse to the cross-sectional view of FIG. 1. As can be seen in FIG. 1 in conjunction with FIG. 7, four screws 8 are provided in the corner areas of the connector cap 5 to fix the connector cap 5 to the housing 7. The upper side contact elements 6a2, 6b2 are placed in a recess of the connector cap 5 between the screws 8, wherein the screws 8 are provided at flanges 14 of the connector cap 5. Instead of the screws 8, other fasteners, e. g. a hinge clamp mechanism according to FIG. 2, may be used to fix the connector cap 5 to the housing 7.

In the depicted example of FIG. 7 the connector cap 5 is provided in the recess 12 of the housing 7, wherein the recess 12 is also provided in the direction shown in this transverse cross-sectional view of FIG. 7. This enables a low constructional height of the entire connection interface 10.

FIG. 8 shows a cross-sectional view of a connection interface 10 according to another embodiment of the invention. The connection interface 10 is configured to receive two FPCs 1. According to the shown embodiment, the FPCs 1 are identical, wherein one connector cap 5 is provided for each FPC 1.

Figures 9, 10:
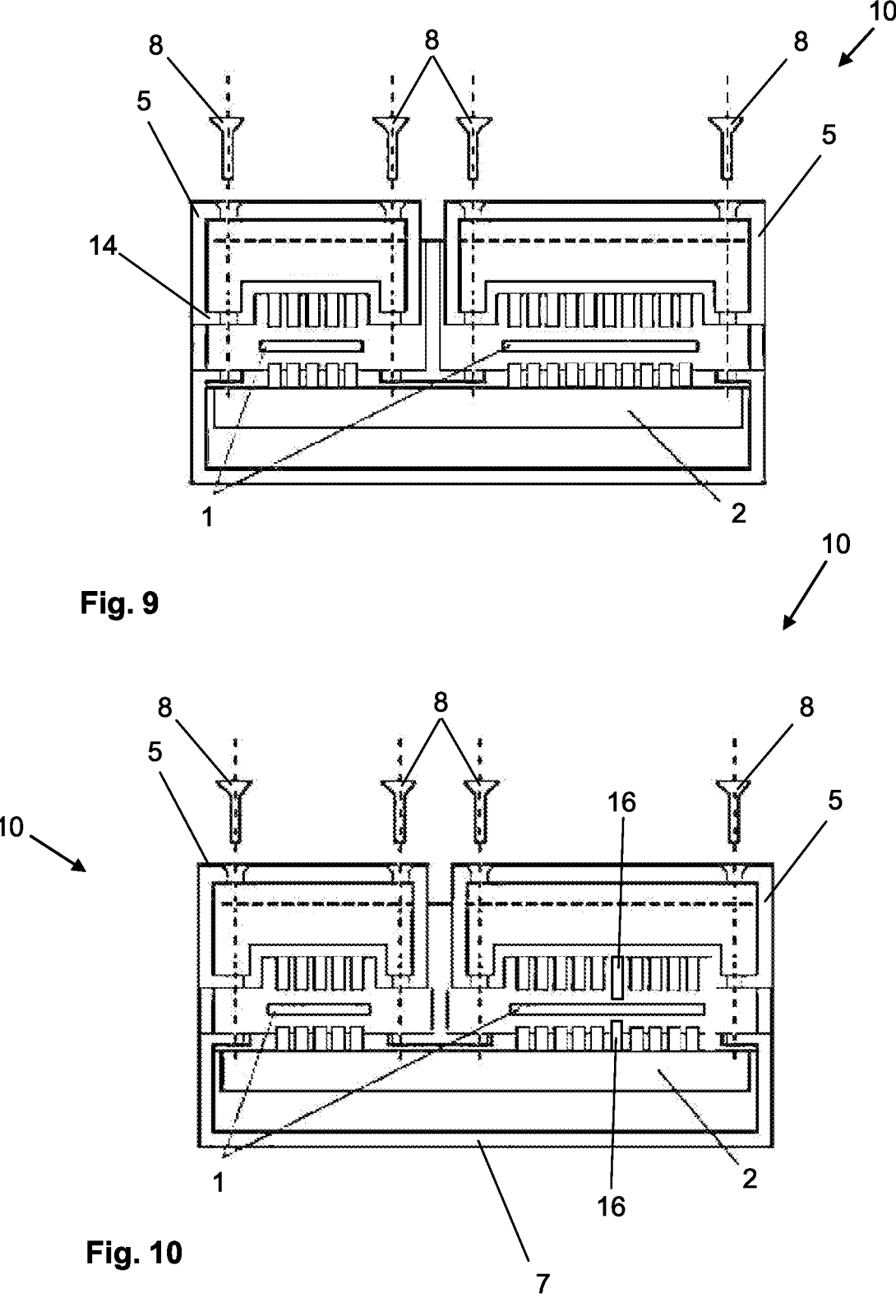
FIG. 9 schematically depicts a cross-sectional view of a connection interface according to another embodiment of the invention.
FIG. 10 schematically depicts a cross-sectional view of a connection interface according to another embodiment of the invention.

FIG. 9 shows a cross-sectional view of a connection interface 10 according to another embodiment of the invention. In contrast to the embodiment of FIG. 8, the FPCs 1 having different widths. Therefore, the two separate connector caps 5 are adapted to the widths of the respective FPC 1. Advantageously, the number of the contact elements 6 is also adapted to the different widths of the FPCs 1.

FIG. 10 shows a cross-sectional view of a connection interface 10 according to another embodiment of the invention. In contrast to the embodiment of FIG. 9, a longitudinal separation 16 is provided between the contact elements 6 to segregate the different contact elements 6 and provide electromagnetic interference protection (EMI protection). The longitudinal separation 16 is also shown in FIG. 6.

Figure 11:
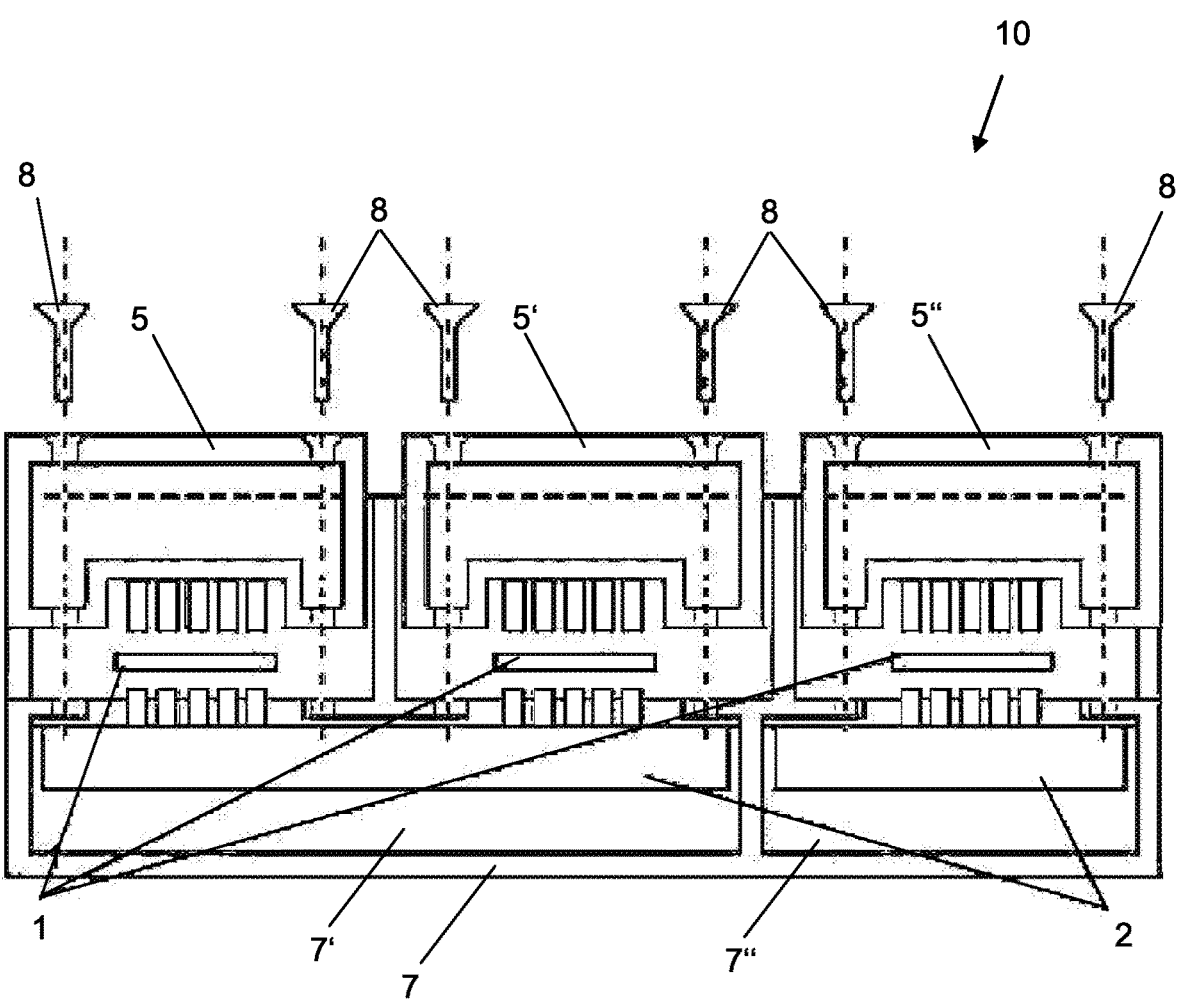
FIG. 11 schematically depicts a cross-sectional view of a connection interface according to another embodiment of the invention.

FIG. 11 shows a cross-sectional view of a connection interface 10 according to another embodiment of the invention. The embodiment shows more than two connector caps 5. The housing 7 has two separate chambers 7' and 7", wherein two connector caps 5 are dedicated to one of the chambers 7'. Different chambers 7', 7" enable electromagnetic interference protection (EMI protection) and power-routing (PWR-routing) and therefore safety requirements for essential or nonessential systems and/or indirect lightning strike effects.

Instead of the shown screws 8 in the foregoing embodiments, clipped lever locks, aircraft camloc fasteners, turn-locks, one touch fasteners and/or a hinge clamp mechanism may be used to fix the connector cap 5 to the housing 7.

In the foregoing detailed description, various features are grouped together in one or more examples or examples with the purpose of streamlining the disclosure. It is to be understood that the above description is intended to be illustrative, and not restrictive. It is intended to cover all alternatives, modifications and equivalents. Many other examples will be apparent to one skilled in the art upon reviewing the above specification. The embodiments were chosen and described in order to best explain the principles of the invention and its practical applications, to thereby enable others skilled in the art to best utilize the invention and various embodiments with various modifications as are suited to the particular use contemplated.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE SIGNS

1 flexible printed circuit
2 printed circuit board
3 first contact area
4 second contact area

9

5 connector cap
6 contact elements
7 housing
8 screw
9 hinge clap mechanism
10 connection interface
11 connection lines
12 recess
13 seal
14 flange
15 separation
16 longitudinal separation

The invention claimed is:

1. A connection interface for connecting a flexible printed circuit to an electrical equipment and a printed circuit board, comprising:

a first contact area configured to receive signals from a flexible printed circuit;

a second contact area configured to transmit the signals from the first contact area to a printed circuit board; and a connector cap configured to transmit the signals from the first contact area to the second contact area, wherein the first contact area and the second contact area are arranged in neighbored areas at the connector cap, wherein the first contact area comprises a plurality of contact elements, and, wherein contact elements from the plurality of contact elements in the first contact area comprise lower side contact elements and upper side contact elements, and the flexible printed circuit is configured to be placed between the lower side contact elements and upper side contact elements.

2. The connection interface according to claim 1, wherein the connector cap is configured to be arranged parallel to the flexible printed circuit and the printed circuit board when the first and second contact areas are in a contacted position with the flexible printed circuit and the printed circuit board.

3. The connection interface according to claim 1, wherein the connector cap is configured to be arranged parallel to the flexible printed circuit and transverse to the printed circuit board when the first and second contact areas are in a contacted position with the flexible printed circuit and the printed circuit board.

4. The connection interface of claim 1, wherein contact elements from the plurality of contact elements are configured as spring elements.

5. The connection interface according to claim 1, wherein the second contact area comprises a plurality of contact elements, wherein contact elements from the plurality of contact elements in the second contact area comprise lower side contact elements and upper side contact elements, and, wherein the printed circuit board is configured to be contacted with the lower side contact elements, and the upper side contact elements contact the lower side elements in a contacted position.

6. The connection interface according to claim 1, further comprising: a housing configured to receive the printed circuit board, wherein the connector cap is configured to be fastened at the housing.

7. The connection interface according to claim 6, wherein the connector cap is fastened by at least one screw, lipped lever lock, aircraft camloc fastener, turnlock, one touch fastener, clamp or bayonet fixation, a hinge clap mechanism, or a combination thereof.

8. The connection interface according to claim 6, wherein the flexible printed circuit is configured to be placed between the housing and the connector cap.

9. The connection interface according to claim 6, wherein the connector cap is configured to be arranged parallel to the flexible printed circuit and transverse to the printed circuit board when the first and second contact areas are in a contacted position with the flexible printed circuit and the printed circuit board, and further comprising: connection lines arranged to contact the second contact area with the printed circuit board, wherein the connection lines are angles within the housing.

10. The connection interface according to claim 6, wherein the housing comprises a recess, wherein the connector cap is configured to be places within the recess.

11. The connection interface according to claim 6, wherein a seal is arranged between the connector cap and the housing.

12. The connection interface according to claim 6, wherein the connector cap comprises a flange configured to be contacted with the housing.

13. The connection interface according to claim 1, wherein the connector cap comprises more than one first contact area and more than one second contact area arranged in neighbored areas at the connector cap configured to receive signals from more than one flexible printed circuit.

14. A connection interface for connecting a flexible printed circuit to an electrical equipment and a printed circuit board, comprising:

a first contact area configured to receive signals from a flexible printed circuit;

a second contact area configured to transmit the signals from the first contact area to a printed circuit board; and a connector cap configured to transmit the signals from the first contact area to the second contact area, wherein the first contact area and the second contact area are arranged in neighbored areas at the connector cap, wherein the second contact area comprises a plurality of contact elements, wherein contact elements from the plurality of contact elements in the second contact area comprise lower side contact elements and upper side contact elements, and, wherein the printed circuit board is configured to be contacted with the lower side contact elements, and the upper side contact elements contact the lower side elements in a contacted position.

* * * * *